United States Patent
Guo

(10) Patent No.: US 9,929,183 B2
(45) Date of Patent: Mar. 27, 2018

(54) ARRAY SUBSTRATE, MANUFACTURING METHOD OF ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 107 days.

(21) Appl. No.: 14/387,504

(22) PCT Filed: Jun. 9, 2013

(86) PCT No.: PCT/CN2013/077051
§ 371 (c)(1),
(2) Date: Sep. 23, 2014

(87) PCT Pub. No.: WO2014/146358
PCT Pub. Date: Sep. 25, 2014

(65) Prior Publication Data
US 2016/0163737 A1 Jun. 9, 2016

(30) Foreign Application Priority Data
Mar. 19, 2013 (CN) .......................... 2013 1 0088468

(51) Int. Cl.
*H01L 27/12* (2006.01)

(52) U.S. Cl.
CPC .......... *H01L 27/124* (2013.01); *H01L 27/127* (2013.01); *H01L 27/1259* (2013.01)

(58) Field of Classification Search
CPC ......... G02F 1/133707; G02F 1/134336; G02F 2201/40; G02F 1/136213; G02F 1/1393;
(Continued)

(56) References Cited

U.S. PATENT DOCUMENTS

2006/0145157 A1    7/2006  Choi et al.
2008/0036930 A1*   2/2008  Konno .............. G02F 1/134363
                                                            349/33
(Continued)

FOREIGN PATENT DOCUMENTS

CN        1797159 A        7/2006
CN      102637631 A        8/2012
(Continued)

OTHER PUBLICATIONS

First Chinese Office Action Appln. No. 201310088468.6; dated Aug. 22, 2014.
(Continued)

*Primary Examiner* — Michael Carter
*Assistant Examiner* — Mohammed R Alam
(74) *Attorney, Agent, or Firm* — Ladas & Parry LLP

(57) ABSTRACT

Embodiments of the present invention disclose an array substrate, a manufacturing method of the array substrate and a display device, and the manufacturing method of the array substrate comprises: forming a gate line and a gate electrode on a base substrate; forming a gate insulating layer above the gate line and the gate electrode; successively depositing a semiconductor layer and a metal layer above the gate insulating layer, and forming an active layer, a source electrode and a drain electrode that are disposed above the gate electrode and a residual semiconductor layer disposed (Continued)

above the gate line and a signal line covering the residual semiconductor layer by using one patterning process; performing a patterning process for the signal line, the residual semiconductor layer disposed below the signal line and the gate insulating layer to form a via hole, so that a surface of the gate line, side sectional surfaces of the signal line, side sectional surfaces of the residual semiconductor layer and side sectional surfaces of the gate insulating layer are exposed through the via hole; and forming a lapping conductive layer at a position where the via hole is located, so that the signal line and the gate line are electrically connected.

11 Claims, 2 Drawing Sheets

(58) Field of Classification Search
CPC ............. H01L 27/1225; H01L 27/1255; H01L 29/78648; H01L 29/78678
See application file for complete search history.

(56) References Cited

U.S. PATENT DOCUMENTS

| | | | | |
|---|---|---|---|---|
| 2009/0122211 | A1* | 5/2009 | Mori | G02F 1/133555 349/42 |
| 2012/0104404 | A1* | 5/2012 | Kwack | H01L 27/1288 257/72 |
| 2012/0248443 | A1* | 10/2012 | Katsui | G02F 1/1368 257/57 |

FOREIGN PATENT DOCUMENTS

| | | |
|---|---|---|
| CN | 203117620 U | 8/2013 |
| CN | 102446925 A | 5/2015 |

OTHER PUBLICATIONS

Second Chinese Office Action Appln. No. 201310088468.6; dated Jan. 16, 2015.
Written Opinion of the International Searching Authority dated Dec. 13, 2013; PCT/CN2013/077051.

* cited by examiner

ARRAY SUBSTRATE, MANUFACTURING METHOD OF ARRAY SUBSTRATE AND DISPLAY DEVICE

TECHNICAL FIELD

Embodiments of the present invention relate to an array substrate, a manufacturing method of the array substrate and a display device.

BACKGROUND

A thin film transistor liquid crystal display (TFT-LCD) comprises an array substrate and a color filter substrate cell-assembled with liquid crystal interposed therebetween. The array substrate is formed with gate lines, data lines and a plurality of pixel units arranged in a matrix, and each pixel unit is provided with a thin film transistor, a pixel electrode and so on.

For example, FIG. 1 is a cross-sectional structural view of the array substrate obtained during various steps according to a conventional manufacturing method of the array substrate. As shown in FIG. 1, the conventional manufacturing method of the array substrate comprises:

Step S101: a gate electrode 1 and a gate line 2 are formed. A gate metal material layer is deposited on a base substrate, and the gate electrode 1 and the gate line 2 are formed through a patterning process using a mask, as illustrated in FIG. 1A.

Step S102: a gate insulating layer 3 and an active layer 4 are formed. An insulating material layer is deposited above the gate electrode 1 and the gate line 2 to form the gate insulating layer 3; a semiconductor layer is deposited on the gate insulating layer 3; and the active layer 4 disposed above the gate electrode 1 is formed through a patterning process using a mask, as illustrated in FIG. 1B.

Step S103: a pixel electrode 6 is formed. A transparent conductive film is deposited above the active layer 4 and the transparent conductive film is patterned through a patterning process using a mask to form the pixel electrode 6, as illustrated in FIG. 1C.

Step S104: a gate insulating layer via hole 9 electrically connecting the gate line and a signal line is formed. Through a patterning process using a mask, the gate insulating layer via hole 9 is formed at a position of the gate insulating layer 3 corresponding to the signal line to be formed, so that the subsequently-formed signal line is electrically connected to the gate line 2 through the gate insulating layer via hole 9, as illustrated in FIG. 1D.

Step S105: a metal layer is deposited to form the signal line 5, a source electrode 51 and a drain electrode 52. The metal layer is deposited above the gate insulating layer with the gate insulating layer via hole 9 formed therein; the source electrode 51 and the drain electrode 52 disposed above the gate electrode 1 and the active layer 4 are formed through a patterning process using a mask; the drain electrode 52 is connected to the pixel electrode 6; at the same time when the source/drain electrodes are formed, the signal line 5 disposed above the gate line 2 is also formed; and the signal line 5 is electrically connected to the gate line 2 through the gate insulating layer via hole 9, as illustrated in FIG. 1E.

Step S106: a passivation layer 7 is formed on the source/drain electrodes, and the passivation layer 7 is patterned through a patterning process using a mask to form a passivation layer via hole 10 that is used for an electric connection between a common electrode and the signal line, as illustrated in FIG. 1F.

Step S107: a common electrode layer is deposited on the passivation layer 7 and patterned through a patterning process using a mask to form the common electrode 8, and the common electrode 8 is electrically connected to the signal line 5 through the passivation layer via hole 10, so that the gate line 2, the signal line 5 and the common electrode 8 are electrically connected to each other, as illustrated in FIG. 1G.

Herein, the patterning process using a mask comprises coating a photoresist, exposing the photoresist using the mask, developing, etching, removing the photoresist and the like.

In the above-mentioned conventional manufacturing method of the array substrate, a via hole is formed in a gate insulating layer, then a metal layer is deposited, so that an electric connection between the gate line and the signal line is realized, and then the patterning processes for source/drain electrodes, a passivation layer and the like are performed, so it is required to use masks seven times to perform the patterning processes, but the excessive use of the masks affects the producing efficiency greatly, so that the cost is increased, the process is more complicated and the yield is further reduced.

SUMMARY

Embodiments of the present invention provide an array substrate, a manufacturing method of the array substrate and a display device, which can reduce the amount of the masks that are used as compared with the current technology.

In one aspect, an embodiment of the present invention provides a manufacturing method of an array substrate, and the method comprises: forming a gate line and a gate electrode on a base substrate; forming a gate insulating layer above the gate line and the gate electrode; successively depositing a semiconductor layer and a metal layer above the gate insulating layer, and forming an active layer, a source electrode and a drain electrode that are disposed above the gate electrode and a residual semiconductor layer disposed above the gate line and a signal line covering the residual semiconductor layer by using one patterning process; performing a patterning process for the signal line, the residual semiconductor layer disposed below the signal line and the gate insulating layer to form a via hole, so that a surface of the gate line, side sectional surfaces of the signal line, side sectional surfaces of the residual semiconductor layer and side sectional surfaces of the gate insulating layer are exposed through the via hole; and forming a lapping conductive layer at a position where the via hole is located, so that the signal line and the gate line are electrically connected.

In another aspect, an embodiment of the present invention provides an array substrate, comprising: a gate line and a gate electrode, formed on a base substrate; a gate insulating layer, covering the gate line and the gate electrode; an active layer, a source electrode and a drain electrode, formed on the gate insulating layer and disposed above the gate electrode; a residual semiconductor layer, formed on the gate insulating layer and disposed above the gate line; a signal line, covering the residual semiconductor layer; a via hole, formed in the signal line, the residual semiconductor layer and the gate insulating layer, wherein a side wall of the via hole exposes side sectional surfaces of the gate insulating layer, the signal line and the residual semiconductor layer, and a bottom surface of the via hole exposes a surface of the gate line; and a lapping conductive layer, formed inside the via hole and electrically connects the signal line and the gate line.

In yet another aspect, an embodiment of the present invention provides a display device, comprising: an array substrate above-mentioned; and an opposite substrate, opposed to the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
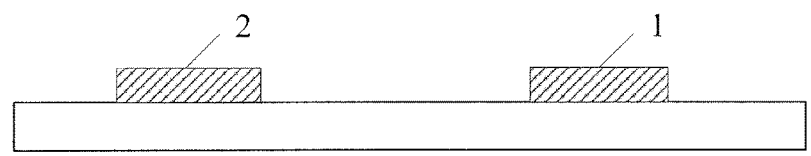
FIG. 1A-FIG. 1G are cross-sectional structural views of an array substrate obtained during various steps of forming the array substrate according to a conventional manufacturing method of the array substrate.
Figure 1B:
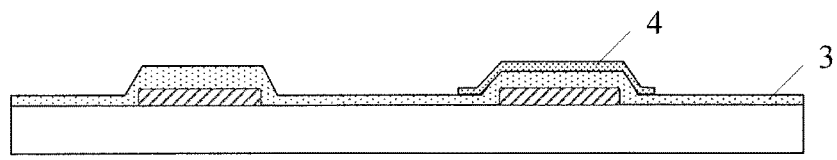
Figure 1C:
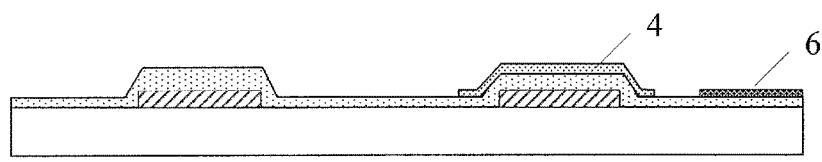
Figure 1D:
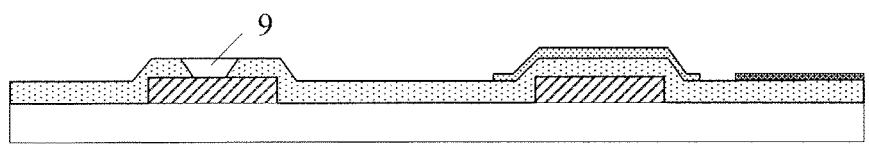
Figure 1E:
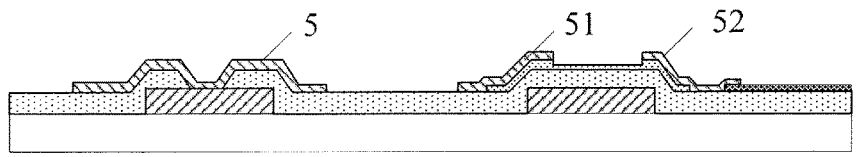
Figure 1F:
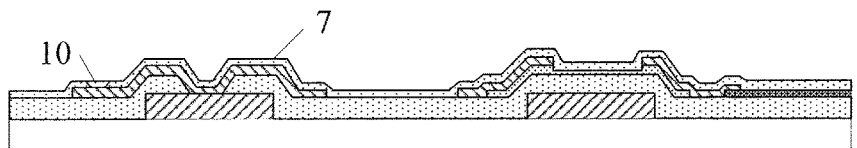
Figure 1G:
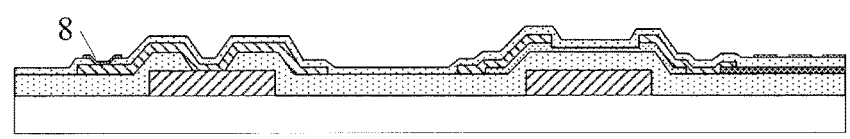

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

With an array substrate, a manufacturing method of the array substrate and a display device according to embodiments of the present invention, one patterning process is performed to a metal layer and a semiconductor layer by using one same mask to form an active layer, source/drain electrodes and a signal line that covers a residual semiconductor layer, and then a via hole with a side wall thereof exposing side sectional surfaces of the signal line and the residual semiconductor layer and with a bottom surface thereof exposing a surface of a gate line is formed, followed by forming an lapping conductive layer that electrically connects the signal line and the gate line in the via hole, which can not only achieve the electric connection between the signal line and the gate line, but also can reduce the amount of masks that are used.

A First Embodiment

In a manufacturing method of an array substrate provided by the first embodiment of the present invention, firstly, a gate electrode 1 and a gate line 2 are formed on a base substrate, and a gate insulating layer 3 is formed on the gate line 2 and the gate electrode 1; then, a semiconductor layer and a metal layer are successively deposited above the gate insulating layer 3, and one patterning process is performed to the semiconductor layer and the metal layer using one same mask to form an active layer 4, a source electrode 51 and a drain electrode 52 that are disposed above the gate electrode 1, as well as a signal line 5 that is disposed above the gate line 2 and covers a residual semiconductor layer 401; and then a via-hole forming process for the signal line 5, the residual semiconductor layer 401 disposed below the signal line and the gate insulating layer 3 is performed to form a via hole 11, so that a side wall of the via hole 11 exposes side sectional surfaces of the signal line 5 and side sectional surfaces of the semiconductor layer 401, and a bottom surface of the via hole 11 exposes a surface of the gate line 2; finally, an lapping conductive layer that electrically connects the signal line 5 and the gate line 2 is formed at a position of the via hole 11.

In the embodiments of the present invention, one patterning process for the metal layer and the semiconductor layer can be performed by using one same mask to form the active layer, the source/drain electrodes and the signal line that covers the residual semiconductor layer, then the via hole with the side wall thereof exposing the side sectional surfaces of the signal line and the residual semiconductor layer and with the bottom surface thereof exposing the surface of the gate line is formed, followed by forming the lapping conductive layer that electrically connects the signal line and the gate line in the via hole. This can not only achieve the electric connection between the signal line and the gate line, but also can reduce the amount of masks that are used.

Hereinafter, with reference to FIGS. 2A-2F, the manufacturing method according to the embodiments of the present invention will be described in detail, and the manufacturing method according to the embodiments of the present invention comprises the following steps.

Step S301: a first patterning process is performed using a first mask to form the gate electrode 1 and the gate line 2.

Figure 2A:
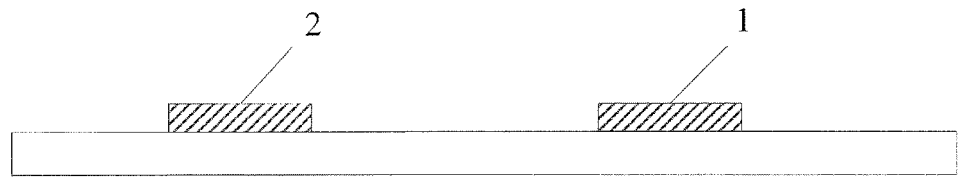
FIG. 2A-FIG. 2F are cross-sectional structural views of an array substrates obtained during various steps of forming the array substrate according to a manufacturing method of the array substrate provided by the embodiments of the present invention.

Exemplarily, in the embodiments of the present invention, after depositing a gate metal film on a base substrate by using a magnetron sputtering method or a thermal evaporation method, the first patterning process may be performed using the first mask to form the gate electrode 1 and the gate line 2, as illustrated in FIG. 2A.

Step S302: after the step S301, a gate insulating layer, a semiconductor layer and a metal layer are successively deposited.

Exemplarily, in the embodiments of the present invention, a plasma enhanced chemical vapor deposition method, for example, may be used to deposit the gate insulating layer 3 on the gate electrode 1 and the gate line 2, then the semiconductor layer is deposited on the gate insulating layer 3. In the embodiments of the present invention, in this step, no patterning process is performed to the semiconductor layer, but the magnetron sputtering method or the thermal evaporation method is then used to deposit the metal layer, followed by a step S303.

Step S303: a second patterning process is performed by using a second mask to form the active layer 4, the source electrode 51, the drain electrode 52 and the signal line 5.

Exemplarily, in the second patterning process, the active layer 4, the source electrode 51 and the drain electrode 52 are formed above the gate electrode 1, and the signal line 5 is simultaneously formed above the gate line 2. In the embodiments of the present invention, one patterning process for the semiconductor layer and the metal layer is performed by using the same mask, so a part of the semiconductor layer after etching is retained below the signal line 5, the source electrode 51 and the drain electrode 52. The active layer 4 below the source electrode 51 and the drain electrode 52 is required to contact the source electrode 51 and the drain electrode 52. But the embodiments of the present invention differ from the current technology in that the signal line 5 covers a part of the semiconductor layer, and this part of semiconductor layer is called as the residual semiconductor layer 401 in the embodiments of the present invention.

Step S304: a third patterning process is performed using a third mask to form the via hole 11 with the side wall thereof exposing the side sectional surfaces of the signal line 5 and the side sectional surfaces of the residual semiconductor layer 401, and with the bottom surface thereof exposing the gate line 2.

Exemplarily, in the embodiments of the present invention, it's required to perform a patterning process to the signal line 5, the residual semiconductor layer 401 and the gate insulating layer 3 to form the via hole 11, so that the side wall of the via hole 11 exposes the side sectional surface of the signal line 5 and the side sectional surface of the residual semiconductor 401, and the bottom surface of the via hole 11 exposes an upper surface of the gate line 2, which is made be capable for electrically connecting the gate line 2 and the signal line 5.

Figure 2B:
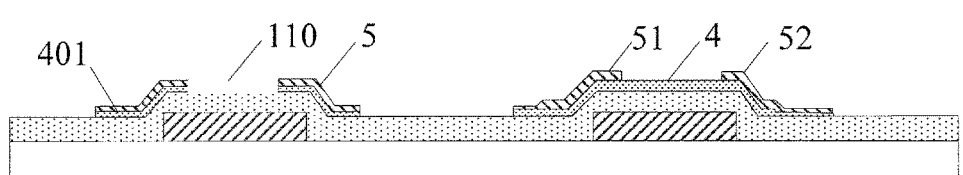
Figure 2C:
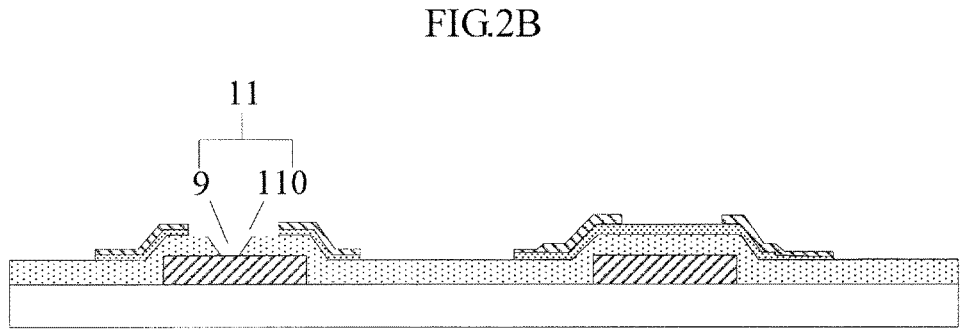

Alternatively, in the embodiments of the present invention, at the same time when the active layer 4, the source/drain electrodes 51 and the signal line 5 are formed by using the second patterning process, a containing space 110 with a side wall thereof exposing the side sectional surface of the signal line 5 and the side sectional surface of the semiconductor layer 401 and with a bottom surface thereof exposing a surface of the gate insulating layer 3 is formed at a position where the via hole 11 is to be formed, as illustrated in FIG. 2B; then, the third patterning process for the gate insulating layer at a position exposed by the containing space 110 is performed to form a gate insulating layer via hole 9 with a bottom surface thereof exposing the surface of the gate line 2, as illustrated in FIG. 2C, and the containing space 110 and the gate insulating layer via hole 9 together form the via hole 11.

By employing the above-mentioned alternative, a subsequent process of forming the gate insulating layer via hole 9 involves directly performing a single-layer patterning process to the gate insulating layer 3, so a size of the via hole and the uniformity of the process can be controlled more precisely.

Step S305: a fourth patterning process is performed by using a fourth mask to form a pixel electrode 6, and to simultaneously form the lapping conductive layer 12 that electrically connects the signal line 5 and the gate line 2.

Figure 2D:
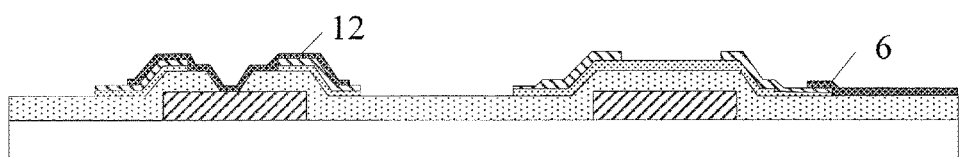

Alternatively, in the embodiments of the present invention, the lapping conductive layer 12 are formed by using a same conductive material as the pixel electrode 6, and the lapping conductive layer 12 is formed at the same time when the pixel electrode 6 is formed. Exemplarily, a transparent conductive film may be deposited on the array substrate after the above-mentioned steps, and the fourth patterning process is performed by using the fourth mask to form the pixel electrode that is connected to the drain electrode and the lapping conductive layer 12 that electrically connects the signal line 5 and the gate line 2 simultaneously, as illustrated in FIG. 2D.

Exemplarily, the transparent conductive film that forms the pixel electrode 6 and the lapping conductive layer 12 may be made from one or more metal oxides of ITO (Indium Tin Oxide), IZO (Indium Zinc Oxide) and the like.

Exemplarily, in the embodiments of the present invention, the conductive film may be filled in only the via hole, so that the signal line 5 exposed by the side wall of the via hole and the gate line 2 exposed by the bottom surface are electrically connected, without using a mask. Certainly, in the embodiments of the present invention, the conductive layer may further be deposited both above the signal line 5 and inside the via hole to form the lapping conductive layer 12 that electrically connects the signal line 5 and the gate line 2, and thus, the electric connection between them is more stable.

Step S306: a fifth patterning process is performed by using a fifth mask to form a passivation layer 7 that includes a passivation layer via hole 10.

Figure 2E:
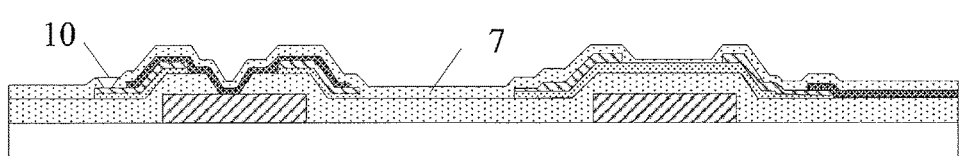

Exemplarily, in the embodiments of the present invention, after the above-mentioned patterning processes, a layer of passivation layer is deposited, and through the patterning process using the fifth mask, the passivation layer 7 that includes the passivation layer via hole 10 is formed. In the embodiments of the present invention, the passivation layer via hole 10 is disposed above a position corresponding to the signal line 5, with a bottom surface thereof exposing a surface of the signal line 5, as illustrated in FIG. 2E.

Figure 2F:
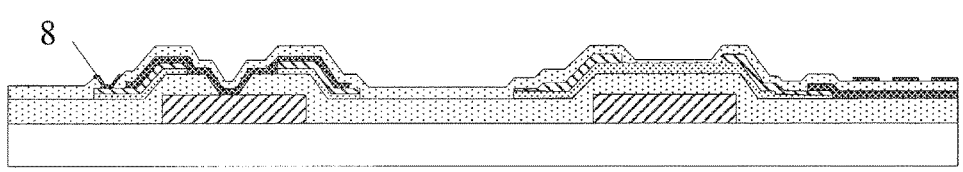

Step S307: a sixth patterning process is performed through a sixth mask to form a common electrode 8 on the passivation layer 7, and the common electrode 8 is electrically connected to the signal line 5 through the passivation layer via hole 10, as illustrated in FIG. 2F.

In the above-mentioned method of forming the array substrate in the embodiments of the present invention, firstly, a patterning process for the gate line and the gate electrode is performed, then, the gate insulating layer, the semiconductor layer and the metal layer are deposited, and a patterning process is performed by using the same mask to form the active layer and the signal line, and so on. This reduces the amount of the masks that are used.

Alternatively, in the embodiments of the present invention, at a position where a via hole corresponding to the gate line is required to be formed, the containing space with the side wall thereof exposing the active layer and the signal line and with the bottom surface thereof exposing the gate insulating layer is formed firstly, then a single-layer via-hole forming process for the gate insulating layer is performed to form the gate insulating layer via hole with the bottom surface thereof exposing the gate line, and on the basis of retaining the current single-layer etching process, the reduction in the amount of masks is achieved, and the connection between the signal line and the gate line also can be realized. In the meanwhile, in the embodiments of the present invention, at the same time when the pixel electrode is formed, the lapping conductive layer disposed in the same layer as the pixel electrode is formed, which can reduce the amount of the masks as well as further reduce the manufacturing-processing steps.

A Second Embodiment

The second embodiment of the present invention further provides an array substrate manufactured by using the manufacturing method of the above-mentioned embodiment, the array substrate comprises: a gate line 2 and a gate electrode 1, formed on a base substrate; a gate insulating layer 3, covering the gate line 2 and the gate electrode 1; an active layer 4, a source electrode 51 and a drain electrode 52, formed on the gate insulating layer 3 and above the gate electrode 2; a residual semiconductor layer 401, formed on gate insulating layer 3 and above the gate line; a signal line 5, covering the residual semiconductor layer 401; and a via hole 11, with a side wall thereof exposing side sectional surfaces of the signal line 5 and side sectional surfaces of the residual semiconductor layer 401 and with a bottom surface thereof exposing a surface of the gate line 2 and provided in the signal line 5, the residual semiconductor layer 401 and the gate insulating layer 3. Inside the via hole 11, an lapping conductive layer 12 that electrically connects the signal line 5 and the gate line 2 is formed.

Alternatively, in the embodiments of the present invention, the via hole 11 may comprise a containing space 110 and a gate insulating layer via hole 9. The containing space 110 is formed by the signal line 5 and the residual semiconductor layer 401 through a patterning process, with its side wall exposing the signal line 5 and the residual semiconductor layer 401 and its bottom surface exposing a surface of the gate insulating layer 3; and the gate insulating layer via hole 9 is formed from the gate insulating layer 3 through a via-hole forming process with its bottom surface exposing a surface of the gate line 2.

Further, in the embodiments of the present invention, the lapping conductive layer 12 is a metal thin film, a part of which is disposed inside the via hole 11 and a part of which is disposed above the signal line 5.

Alternatively, in the embodiments of the present invention, the array substrate further comprises a pixel electrode 6 that is connected to the drain electrode, and the lapping conductive layer 12 and the pixel electrode 6 are disposed in the same layer.

Furthermore, the embodiments of the present invention, the array substrate further comprises a passivation layer above the pixel electrode, the lapping conductive layer and the signal line and so on; at a position corresponding to the signal line 5 of the passivation layer, a passivation layer via hole 10 is provided with a bottom surface exposing a surface of the signal line 5. The array substrate further comprises a common electrode 8 that is electrically connected to the signal line 5 through the passivation layer via hole 10.

A cross-sectional view of a structure of the array substrate provided by the embodiments of the present invention may be referred to FIG. 2F.

In the array substrate provided by the embodiments of the present invention, the residual semiconductor layer is provided above the gate line and below the signal line, therefore, in the manufacturing process, one patterning process can be performed using a same mask to form the active layer, the source electrode, the drain electrode and the signal line, which reduces the amount of the masks that are used and improves the production efficiency.

A Third Embodiment

The third embodiment of the present invention further provides a display device, which comprises the array substrate according to the second embodiment of the present invention.

One example of the display device is a liquid crystal display device, wherein the array substrate and an opposite substrate are disposed to face each other to form a liquid crystal cell, and liquid crystal material is filled in the liquid crystal cell. The opposite substrate is a color filter substrate, for example. The pixel electrode of each pixel unit of the array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display (OLED) device, wherein a pixel electrode of each pixel unit of the array substrate is used as an anode or a cathode to drive an organic light-emitting material to emit light so as to perform a displaying operation.

The array substrate included in the display device provided by the third embodiment of the present invention comprises the residual semiconductor layer above the gate line and below the signal line, therefore, in the manufacturing process, one patterning process may be performed using a same mask to form the active layer, the source electrode, the drain electrode and the signal line, which reduces the amount of the masks that are used and improves the production efficiency.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of an array substrate, comprising:
    forming a gate line and a gate electrode on a base substrate;
    forming a gate insulating layer above the gate line and the gate electrode;
    successively depositing a semiconductor layer and a metal layer above the gate insulating layer, and forming simultaneously an active layer, a source electrode and a drain electrode that are disposed above the gate electrode and a residual semiconductor layer disposed above the gate line and a signal line covering the residual semiconductor layer by using one patterning process;
    performing a patterning process for the signal line, the residual semiconductor layer disposed below the signal line and the gate insulating layer to form a via hole, so that a surface of the gate line, side sectional surfaces of the signal line, side sectional surfaces of the residual semiconductor layer and side sectional surfaces of the gate insulating layer are exposed through the via hole; and
    forming a lapping conductive layer at a position where the via hole is located, so that the signal line and the gate line are electrically connected.

2. The method according to claim 1, wherein the forming the via hole comprises:
    forming a containing space exposing the side sectional surfaces of the signal line, the side sectional surfaces of the residual semiconductor layer disposed below the signal line and a surface of the gate insulating layer at the same time of forming the active layer, the source electrode and the drain electrode; and
    performing a patterning process for the exposed surface of the gate insulating layer to form a gate insulating layer via hole that exposes the surface of the gate line.

3. The method according to claim 1, wherein the forming the lapping conductive layer comprises:
    depositing a conductive film inside the via hole and above the signal line to form the lapping conductive layer that electrically connects the signal line and the gate line.

4. The method according to claim 3, wherein the forming the lapping conductive layer comprises:
    depositing a transparent conductive film, and forming a pixel electrode and the lapping conductive layer through a patterning process, wherein the pixel electrode is connected to the drain electrode, and the lapping conductive layer electrically connects the signal line and the gate line.

5. The method according to claim 4, wherein after forming the pixel electrode and the lapping conductive layer, the method further comprises:

depositing a passivation layer thin film, and forming a passivation layer via hole through a patterning process, wherein the passivation layer via hole is disposed at a position corresponding to the signal line and its bottom surface exposes a surface of the signal line.

6. The method according to claim 5, wherein after forming the passivation layer via hole, the method further comprises:

forming a common electrode on the passivation layer, wherein the common electrode is electrically connected to the signal line through the passivation layer via hole.

7. An array substrate, comprising: a gate line and a gate electrode, formed on a base substrate; a gate insulating layer, covering the gate line and the gate electrode; an active layer, a source electrode and a drain electrode, formed on the gate insulating layer and disposed above the gate electrode; a residual semiconductor layer, formed on the gate insulating layer and disposed above the gate line; a signal line, covering the residual semiconductor layer; a via hole, formed in the signal line, the residual semiconductor layer and the gate insulating layer, wherein a side wall of the via hole exposes side sectional surfaces of the gate insulating layer, the signal line and the residual semiconductor layer, and a bottom surface of the via hole exposes a surface of the gate line; and a lapping conductive layer, formed inside the via hole and electrically connects the signal line and the gate line; wherein the array substrate further comprising: a passivation layer; a passivation layer via hole, formed in the passivation layer and at a position corresponding to the signal line with a bottom surface thereof exposing a surface of the signal line; and a common electrode, physically connected to the signal line through the passivation layer via hole.

8. The array substrate according to claim 7, wherein the via hole comprises:

a containing space, exposing the side sectional surfaces of the signal line and the residual semiconductor layer, and a surface of the gate insulating layer; and a gate insulating layer via hole, formed by using a via-hole forming process for the gate insulating layer and exposing the surface of the gate line.

9. The array substrate according to claim 7, wherein the lapping conductive layer is a conductive film with a part thereof disposed inside the via hole and a part thereof disposed above the signal line.

10. The array substrate according to claim 9, further comprises a pixel electrode that is connected to the drain electrode and disposed in a same layer as the lapping conductive layer.

11. A display device, comprising:

an array substrate according to claim 7; and an opposite substrate, opposed to the array substrate.

* * * * *